(12) United States Patent
Kondo

(10) Patent No.: US 6,653,157 B2
(45) Date of Patent: Nov. 25, 2003

(54) MANUFACTURING METHOD FOR DEVICE INCLUDING FUNCTION BLOCK, AND LIGHT TRANSMITTING DEVICE

(75) Inventor: Takayuki Kondo, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/899,576

(22) Filed: Jul. 5, 2001

(65) Prior Publication Data

US 2002/0043659 A1 Apr. 18, 2002

(30) Foreign Application Priority Data

Jul. 6, 2000 (JP) ..................................... P2000-205315
Jul. 3, 2001 (JP) ..................................... P2001-201713

(51) Int. Cl.$^7$ ............................................. H01L 21/00
(52) U.S. Cl. .............................. 438/22; 438/26; 438/28; 438/29; 438/107
(58) Field of Search ................................. 438/106, 107, 438/598, 455, 22, 26, 28, 29

(56) References Cited

U.S. PATENT DOCUMENTS

| | | | | |
|---|---|---|---|---|
| 4,990,462 A | * | 2/1991 | Sliwa, Jr. ..................... | 438/107 |
| 5,545,291 A | | 8/1996 | Smith et al. | |
| 5,783,856 A | | 7/1998 | Smith et al. | |
| 5,824,186 A | | 10/1998 | Smith et al. | |
| 5,904,545 A | | 5/1999 | Smith et al. | |
| 6,281,038 B1 | * | 8/2001 | Jacobsen et al. ............. | 438/106 |

FOREIGN PATENT DOCUMENTS

| | | |
|---|---|---|
| JP | 2000-067449 | 3/2000 |
| JP | 2000-101185 | 4/2000 |

* cited by examiner

*Primary Examiner*—Tuan H. Nguyen
(74) *Attorney, Agent, or Firm*—Harness, Dickey & Pierce, P.L.C.

(57) ABSTRACT

Device 100 of the present invention comprises function block 12. Function block 12 is formed in such a way that the function block 12 is fitted into concavity 11 which is disposed on base body 10, and function block 12 comprises optical element 14. Lens shape part 20 is formed in a predetermined area on function block 12.

17 Claims, 9 Drawing Sheets

MANUFACTURING METHOD FOR DEVICE INCLUDING FUNCTION BLOCK, AND LIGHT TRANSMITTING DEVICE

BACKGROUND OF THE INVENTION

1. Field of the Invention

The present invention relates to a device including a function block and a manufacturing method therefore.

2. Description of Related Art

Recently, as a mounting method for electronic devices, a mounting method which utilizing an FSA (Fluidic Self-Assembly) method has been developed. This FSA method is a technique wherein electronic devices (hereinafter called "function devices") which are of predetermined form and of predetermined size from 10 to hundreds of microns are dispersed in a liquid, this liquid is flowed onto a surface of a base body including a hole or a fitting part which are the same size and shape as this function device, the function devices are mounted onto the base body by fitting this function devices into these holes or fitting part.

An FSA method, for example, is disclosed in a journal regarding Information display (S. Drobac, INFORMATION DISPLAY VOL. 11 (1999) pages 12 to 16), U.S. Pat. Nos. 5,545,291, 5,783,856, 5,824,186, and 5,904,545, etc.

Next, an example of a mounting process for a semiconductor using the FSA method is briefly explained.

1. First, wafers which are made of single crystal silicon and which include hundreds to millions of electronic devices are divided into thousands to millions of function blocks by etching. The function block achieved by this dividing operation has predetermined 3-dimensional form, and each function block has predetermined function. Also, the electronic device may be of a simple construction such as that of a transistor or of a complicated construction such as that of an IC.
2. Separating from the function blocks, the base body into which these function blocks are to be fitted is formed. The holes for fitting function blocks are formed on this base body by carving, by etching, or by laser etc. These hole are formed to conform to the size and the shape of the function blocks.
3. Next, the function blocks formed in this process are dispersed in liquid, and this dispersed liquid is flowed onto the surface of the base body formed in process 2. By this process, function blocks pass over the surface of the base body, and fall into and fit into the holes made on the base body in self-adjusting manner. The function blocks which do not fit into the holes are collected from the dispersed liquid, and are cleaned, and are dispersed again into the cleaned liquid, and are flowed onto other new surface of the base body. During the time wherein the above process is repeated, the function blocks and the dispersed liquid are kept recycled.
4. After being fitted into a hole formed on the base body, the function block is hard-wired by an ordinary method such as a metallizing method, and operates as a part of final electric circuit. By the above process, the function block is mounted onto the semi-conductor device.

According to this FSA method, the cost of a device such as a display can be reduced, and the lead-time for manufacturing can be improved because a large number of function blocks can be mounted onto the base body at one time. Also, the reliability of the device can be improved because the mounting process can be performed by only the pre-inspected, good portions of function blocks.

Also, as a base body for fitting function blocks, various material such as glass, plastic, silicon etc can be used, therefore, the material selectioned to be used as the base body is easily achievable. Also, as a material for the function block, silicon, germanium-silicon, gallium-arsenide, indium-phosphor etc can be choosen according to the necessary functions of the function block. In this way, superior actions and effects are anticipated on FSA method as a mounting method for electronic devices.

BRIEF SUMMARY OF THE INVENTION

By using the device including the function block manufactured by utilizing the FSA method in, for example, an optical device, the development of a highly reliable, low-cost semi-conductor device is sought. An object of the present invention is to provide a device and manufacturing method for a device including a function block.

First Device

In the device including a function block according to the present invention, the function block is made on a concavities formed on the base body. The function block includes a function element at least in one part, and the functionally formed part is formed in a predetermined area on the function block.

Here, the function element is an element which can function as an electronic device. Also, the functionally formed part is of a material which is in the necessary form to produce the predetermined function.

According to this construction, a predetermined function can be exerted by the formation of the functionally formed part in a predetermined area on the function block. There will be a more precise explanation regarding the above-mentioned facts in the detailed description of the invention.

As preferable conditions for the device including the function block, conditions 1 to 4 can be shown as follows.
1. The function block can include a semi-conductor device.
2. The function block can use an optical element as the function element. In this case, the functionally formed part can be formed on the optical element, and can include a lens-shaped part. Here, the optical element should preferably be at least one of a light receiving element or a light emitting element. By this construction, the function of the optical element can be enhanced. More details are given in the detailed description of the invention.
3. Electrodes can be formed in a predetermined area on the function block.
4. Furthermore, a protecting layer can be formed on the function block. In this case, the protecting layer can be formed so as to cover at least one part of the border area between the function block and the base body on the surface of the base body. Furthermore, in this case, a contact hole can be formed in the protecting layer.

Second Device

Also, in the device including the function block according to the present invention, the function block is made on a concavities formed on the base body. Also, the anchoring part for the function block is formed on at least one part of the border area between the function block and the base body on the surface of the base body.

According to this construction, in the case of forming a member on the function block, freer designability can be achieved because the anchoring part can be formed in the minimum necessary area for anchoring the function block.

In this case, the anchoring part is the functionally formed part. Also in this case, the function block can include semi-conductor devices.

First Manufacturing Method

The manufacturing method for the device including the function block in the present invention includes the formation of concavities on the base body, and the self-adjusting fitting process for function blocks having function elements on at least one part into the concavities, and also the manufacturing method of the device including function blocks in the present invention includes the following process (a) and process (b):

(a) process in which liquid stuff is spread on a predetermined area on the function block, and
(b) process in which the liquid stuff is hardened so as to form the functionally formed part.

According to this manufacturing method, simply by supplying the liquid stuff to the function device and by hardening the liquid stuff, the functionally formed part can be formed in self-align manner. As a result, the functionally formed part can be formed by a very simple process without alignment offset.

Second Manufacturing Method

The manufacturing method for the device including the function block in the present invention includes the formation of concavities on the base body, and the self-adjusting fitting process for the function block having the function element on at least one part into the concavity, and also the manufacturing method of the device including the function block in the present invention includes the following process (a) and process (b):

(a) process in which a liquid stuff is spread on a predetermined area on the function block, and
(b) the process in which the functionally formed part is formed by using a stamper having a complementary shaped part against the functionally formed part, and the functionally formed part is formed wherein the liquid stuff is hardened so as to locate the complementary shaped part on the area where the functionally formed part is formed in a condition such that the function block and the stamper are in a coupled position.

According to this manufacturing method, the functionally formed part can easily be formed without alignment offset.

Also, in the process (b), the stamper has a complementary shaped part relative to contact hole, by using the stamper, the functionally formed part can be formed and the contact hole can be formed on the electrode. According to this manufacturing method, because the functionally formed part and the contact hole can be uniformly formed by using the stamper, as compared with the case in which forming the functionally formed part and the contact hole by using, for example, a lithography method, the functionally formed part can be easily formed, and therefore the manufacturing time can be substantially reduced.

As preferable conditions for the first manufacturing method and the second manufacturing method, conditions 1 to 6 can be shown as follows.

(1) The function block can include a semi-conductor device.
(2) The function block can include an optical element as the function element. In this case, this is a process in which the functionally formed part is formed on the optical element, and the process in which the functionally formed part is formed so as to include lens-shape part can be used
(3) Furthermore, the following process (c) can be included as follows.
(c) process in which electrode is formed in order to drive the function block in predetermined area on the function block.
(4) Furthermore, the following process (d) can be included as follows.
(d) process in which a protecting layer is formed on the function block.

In this case, process (d) is a process in which the protecting layer can be formed so as to cover at least one part of the border area between the function block and the base body.
(5) The liquid stuff should preferably include resin or resin precursor.
(6) In the process (a), as a method for applying the liquid stuff in a predetermined area on the function block, for example, a method in which drops of the liquid stuff are formed on the top of a dispenser nozzle, the drops are made to contact a predetermined area of the function block, and the liquid stuff is disposed in the predetermined area, can be used. Alternatively, a method wherein the liquid stuff is ejected onto a predetermined area of the function block by using ink head jet, and the liquid stuff is disposed in a predetermined area, can be used.

Third Manufacturing Method

Furthermore, in the above-mentioned first manufacturing method, the following process (e) can be included.

(e) process in which liquid repelling film which tends to repel the liquid stuff is formed in outside area to the area for forming the functionally formed part before applying the liquid stuff.

In this case, in above-mentioned process (b); which is included in the first manufacturing method should be a process in such a way that the liquid stuff which is repelled by the repelling film is disposed in the area for forming the functionally formed part. This process is explained more precisely in the detailed description of the invention.

Also in this case, the repelling film should preferably be single molecular film made of a compound which adsorbs to the electrode.

Furthermore, in this case, the electrode should preferably be formed of a material including gold, and the single molecular film should preferably be made of thiol including a group having a tendency to repel the liquid stuff to one end terminal.

Fourth Manufacturing Method

The manufacturing method of the device including the function block in the present invention includes the formation of concavities on the base body, and the self-adjusting fitting process for function blocks having function elements on at least one part into the concavities, and also the manufacturing method of the device including function blocks in the present invention includes the following process (a) and process (b).

(a) process in which applying a liquid stuff is applied to at least one part of a border area between the function block and the base body on the surface of the base body, and
(b) process in which the liquid stuff is hardened to form an anchoring part of the function block.

According to this construction, waste of raw material can be reduced because the anchoring part can be formed on the minimum necessary part in order to anchor the function block.

In this case, the anchoring part should preferably be the functionally formed part. Also, the function block can include a semi-conductor device.

A light transmission device in the present invention is characterized in that a device including the above-mentioned function block on which the function block including a light emitting element, and a device including the above-mentioned function block on which the function block including a light receiving element are stacked in such a way that the light emitting element and the light receiving element face each other.

Also, a light transmission device in the present invention is characterized in such a way that, a light emitting part made of a device including the above-mentioned function block on which the function block including light emitting element, and a light receiving part made of a device including the above-mentioned function block on which the function block including light receiving element are stacked in such a way that the light emitting element and the light receiving element face each other.

DETAILED DESCRIPTION OF THE INVENTION

Figure 1:
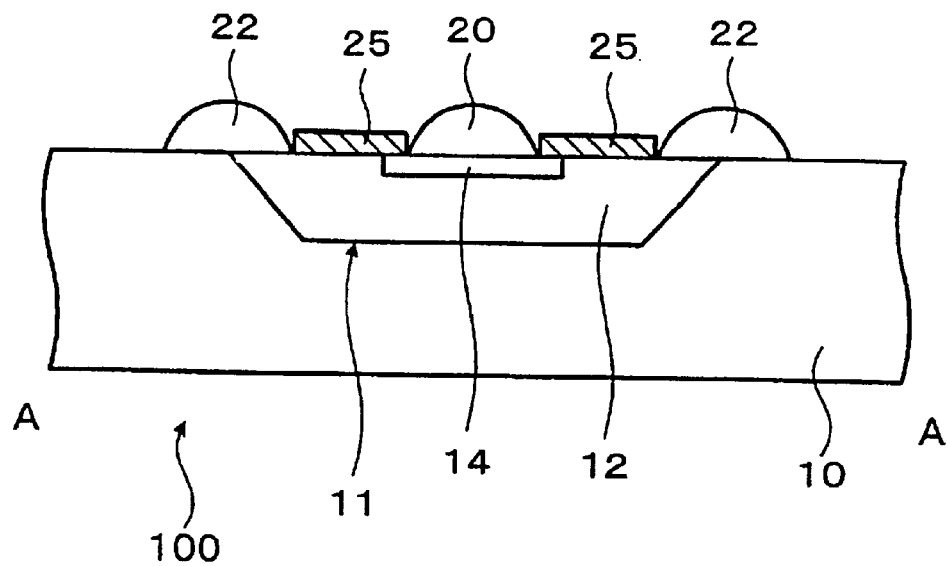
FIG. 1 is a cross section typically illustrating a device including a function block according to the first embodiment of the present invention.

Preferred embodiments of the present invention will be explained with reference to the drawings.
First Embodiment
Construction of the Device FIG. 1 is a cross section typically illustrating a device 100 including function block 12 according to the first embodiment of the present invention. FIG. 1 shows a cross section taken along along line A—A in FIG. 2.

Device 100 includes base body 10 and function block 12 arranged on concavities 11 of base body 10.

Base body 10 comprises material such as silicon, glass, and plastics. The material of the base body 10 is appropriately chosen according to the type of function element and function block 12, and also according to the purpose of device 100.

Function block 12 is formed in such a way that the function block 12 fits into the concavities 11 of the base body 10 by using the FSA method. Function block 12 can include a semi-conductor device. In FIG. 1, the example function block 12 is in the form of an inverted truncated pyramid: the shape of the function block 12 is not limited, and therefore the shape of the function block 12 can be modified according to the the intended use and the desired functions thereof.

On the surface of the function block 12, optical element 14 is formed as the function element. Optical element 14 can be, for example, a light emitting element such as a VCSEL (vertical cavity surface emitting laser), LED (light emitting diode), EL device (electroluminescent device), or a light receiving element such as a photoconductor and a photodiode.

On optical element 14, lens shape part 20 is formed as a functionally formed part. Lens shape part 20 is transparent, and is of a convex lens shape. That is, the upper surface of the lens shape part 20 constitutes a convex lens surface.

In the case in which optical element 14 is a light emitting element, lens shape part 20 has a function of refracting the light emitted from optical element 14. On the other hand, in the case in which optical element 14 is a light receiving element, lens shape part 20 has a function of refracting the light and makes the light converge at a predetermined area of optical element 14.

The material of the lens shape part 20 is not limited. However, the material of the lens shape part 20 should preferably be a high polymer compound such as polyimide resin, ultraviolet-curable acrylic resin, or ultraviolet-curable epoxy resin, and a polyimide resin is more preferable.

On function block 12, electrode layers 25 are formed. Electrode layers 25 are upper electrode and are electrically connected with optical element 14 by contact (not shown), and furthermore by the connection of electrode layers 25 with external electrodes (not shown), electricity is supplied to optical element 14. Electrode layers 25 are omitted in the FIG. 2, and lower electrodes are omitted in the FIG. 1 and in the FIG. 2 respectively.

Also, anchoring part 22 is formed so as to cover at least one part of the border area between function block 12 and base body 10 on the surface of the base body 10. Anchoring part 22 also functions as a functionally formed part. That is, anchoring part 22 has a function as a measure which anchors the function block 12 which are fit in concavities 11 of the base body 10.

In this embodiment, the case in which the function element is optical element 14 is shown; however, the function element should not be limited to optical elements, and for example, a transistor can be used. Also, the functionally formed part should not be limited to lens shape part 20 and anchoring part 22, and for example, a plain waveguide and a spacer can be used.

Operation of Device

Operation of device 100 including function block 12 is explained as follows. In the case in which optical element 14 is a light emitting element, light generated by driving of optical element 14 is emitted from a predetermined area of the upper surface of optical element 14. Lens shape part 20 can refract this light emitted at the emitting surface, and can narrow the emission angle. Also, in the case in which the diameter of the emission port for the light formed on the upper surface of the optical element 14, the radiating angle of emitted light can be narrowed by using the lens shape part 20.

On the other hand, in the case in which the optical element 14 is a light receiving element, the light entered into lens shape part 20 reflects and converges to predetermined area of optical element 14. This converged light is converted into an electric signal by optical element 14.

Manufacturing Process of Device

Next, the manufacturing process for device 100 shown in FIG. 1 is explained.

FIGS. 3A, 3B, 4A and 4B are views showing an example of a manufacturing process for device 100.

(1) The formation of function block 12 including optical element 14, and the fitting of function block 12 in concavities 11 are performed by using an FSA method, which was explained in the description of the related art. By this process, a base body 10 in which function block 12 including optical element 14 is disposed can be produced.

Figure 3B:
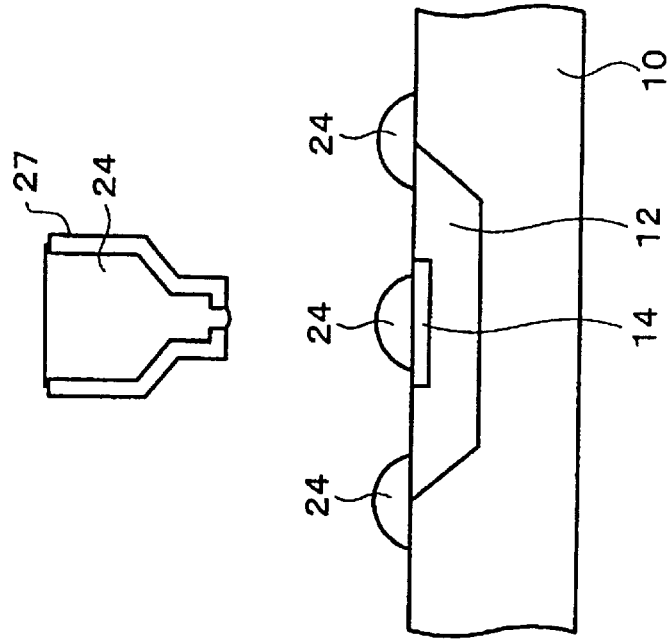
FIG. 3A and FIG. 3B are views showing sequential steps in the method of supplying the liquid stuff on the upper surface of a pillar part by using a nozzle.
Figure 3A:
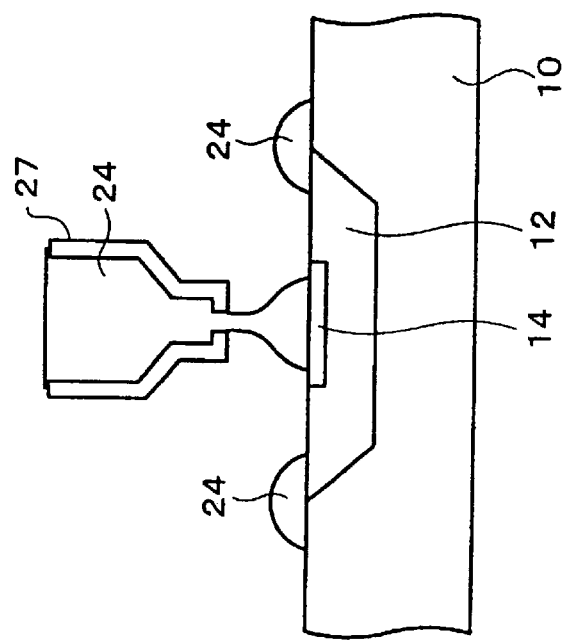

(2) Next, on the upper surface of function block 12, liquid stuff is applied on optical element 14 and in the border area between function block 12 and base body 10. As a method of applying the liquid stuff, the method of supplying the liquid stuff by dispenser nozzle 27 is explained with reference to FIGS. 3A and 3B. FIG. 3A and FIG. 3B are views chronologically showing sequential steps in the method of supplying the liquid stuff 24 on optical element 14 by using nozzle 27.

Resin which forms the material of the laser emitting part, or the liquid stuff 24 of the precursor of the resin, are injected into nozzle 27. After a drop of this liquid stuff 24 is made on the top of the nozzle 27, as shown in FIG. 3A, these drops are made to contact function block 12. Then, as shown in FIG. 3B, nozzle 27 is retracted from optical element 14, and the liquid stuff 24 is transferred onto optical element 14. By using nozzle 27, using the same method, the liquid stuff 24 is formed in the border area between function block 12 and the base body 10.

In this way, according to the method of supplying the liquid stuff onto function block 12 by a nozzle, it is possible to easily control the thickness of the lens shape part 20 by adjusting the viscosity of the liquid stuff, the diameter of the nozzle, and the amount of a drop on the top of the nozzle, and using the coating on the top of the nozzle. In addition, the range of usable liquid stuff is broad because the supplying method for the liquid stuff by the nozzle is less affected by the viscosity of the liquid stuff. Furthermore, the liquid stuff does not adhere to unintended parts because the liquid stuff is securely supplied only to the necessary parts, so there is no waste.

As the liquid stuff of resin, for example, ultraviolet-curable acrylic resin, ultraviolet-curable epoxy resin, etc. may be mentioned. As the liquid stuff of precursor, liquid stuff including a polyimide precursor, a monomer of ultraviolet-curable acrylic resin, and ultraviolet-curable epoxy resin can be mentioned.

Because ultraviolet-curable resin can be hardened only by the ultraviolet light, there is no concern about damage to the element by heat, and flaw separation of the laser emitting part due to differences in thermal expansion between the semi-conductor layer and the resin.

The ultraviolet-curable resin consists of a photopolymerization initiator and at least one type of prepolymer, oligomer, and monomer.

As an example of an ultraviolet-curable acrylic resin, as a prepolymer or oligomer, for example acrylates such as epoxy acrylates, urethane acrylates, polyester acrylates, polyether acrylates, spiro acetal-type acrylate, etc., and methacrylates such as epoxy methacrylates, urethane methacrylates, polyether methacrylates, etc., can be used.

As a monomer, for example a single functional monomer such as 2-ethylhexyl acrylate, 2-ethylhexyl methacrylate, 2-hydroxyethyl acrylate, 2-hydroxyethyl methacrylate, N-vinyl-2-pyrrolidone, carbitol acrylate, tetrahydrofurfuryl acrylate, isobornyl acrylate, dicyclopentenyl acrylate, 1,3-butanediol acrylate, etc., double functional monomers such as 1,6-hexanediol diacrylate, 1,6-hexanediol dimethacrylate, neopentylglycol acrylate, polyethyleneglycol acrylate, neopentylglycol acrylate, pentaerythritol diacrylate, etc., polyfunctional monomers such as trimethylolpropane triacrylate, trimethylolpropane trimethacrylate, pentaerythritol triacrylate, dipentaerythritol hexaarylate, etc., can be mentioned.

As a photopolymerization initiator, for example, acetophenones such as 2,2-dimethoxy-2-phenylacetophenone, butylphenones such as a-hydroxyisobutylphenone, p-isopropyl-a-hydroxyisobutylphenone, halogenated acetophenones such as p-tert-butyldichloroacetophenone, p-tert-butyltrichloroacetophenone, α,α-dichloro-4-phenoxyacetophenone, benzophenones such as benzophenone, N,N-tetraethyl-4,4-diaminobenzophenone, etc., benzyls such as benzyl, benzyl dimethyl ketal, etc., benzoins such as benzoin, benzoin alkyl ether, oximes such as 1-phenyl-1,2-propanedione-2-(o-ethoxycarbonyl)oxime, etc., xanthones such as 2-methylthioxanthone, 2-chlorothioxanthone, etc., benzoin ethers such as benzoin ether, benzoin isobutyl ether etc., radical generating compounds such as Michler's ketones can be mentioned. Resins made after hardening of ultraviolet-curable acrylic resin is desirably transparent, and therefore this resin is suitable for lenses.

As a polyimide precursor, a polyamic acid, long chain alkyl ester of polyamic acid, etc., can be mentioned. Polyimide resin made after polyimide precursor is thermohardened has more than 80% transparency in the range of visible light, and has a refractive index such as from 1.7 to 1.9, so that the large lens-effect can be achieved.

(3) Consequently, liquid stuff 24 is hardened on function block 12; then, lens shape part 20 is formed on optical element 14, and simultaneously, anchoring part 22 is formed in the border area between function block 12 and the base body 10. In the case in which the liquid stuff 24 is the ultraviolet-curable resin which was previously mentioned, the liquid stuff can be hardened by the radiation of the ultraviolet light.

Also, in the case in which the liquid stuff of the polyimide precursor is used as the liquid stuff, the liquid stuff can be hardened by generating an imidization reaction by heat-curing and by generating polyimide resin. The curing temperature depends on the type of precursor, and in the view of damage to optical element 14 organizing function block 12 by heat, the difference in thermal expansion between base body 10 and polyimide resin, prevention of alloying of electrode 25, 150° C. is appropriate for curing temperature.

Figure 4A:
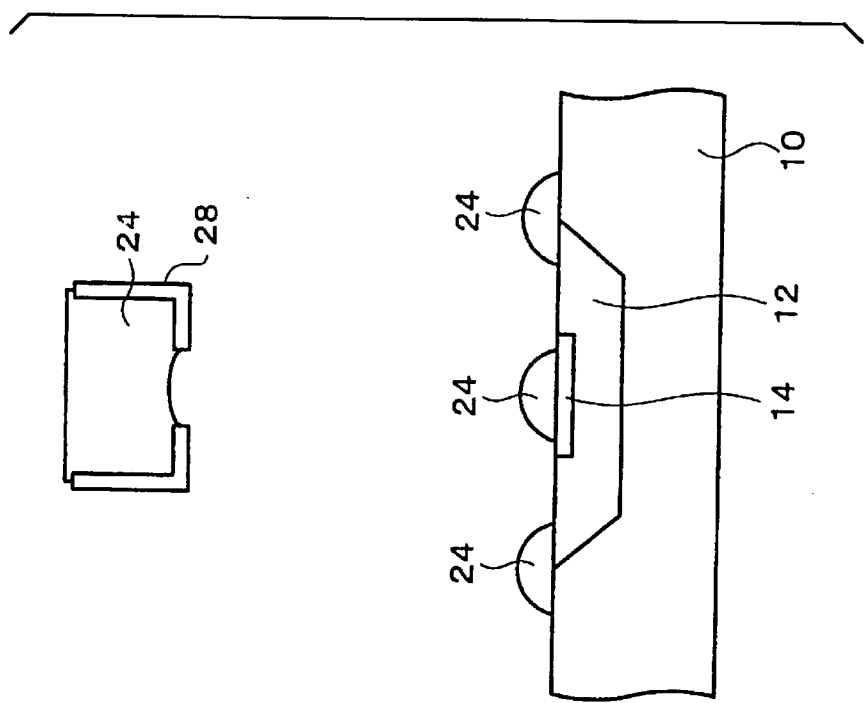
FIG. 4A and FIG. 4B are views showing sequential steps in the method of supplying the liquid stuff on the upper surface of a pillar part by using an ink jet head.
Figure 4B:
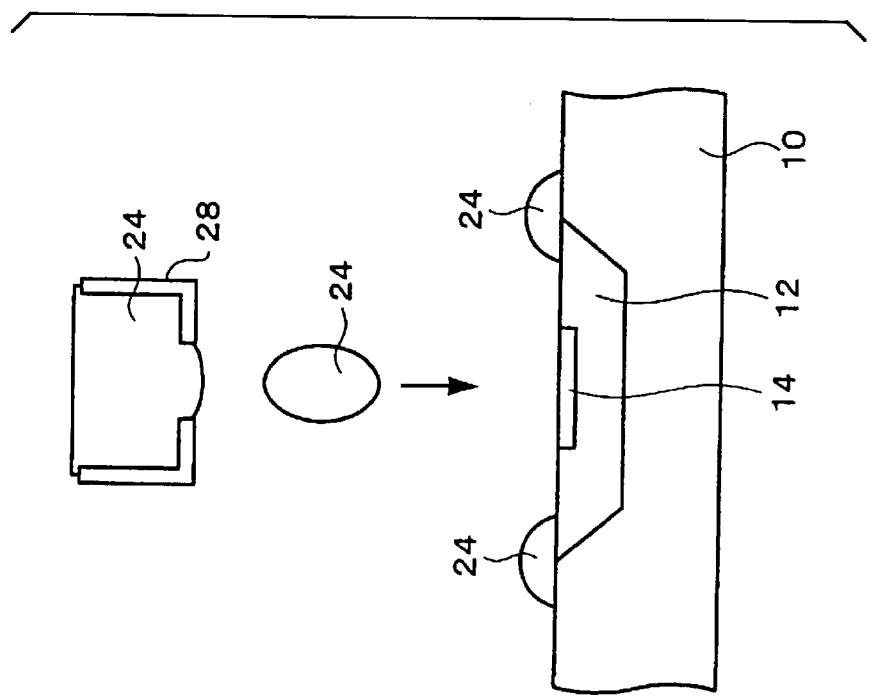

In (2) as previously mentioned, as the supplying method for the liquid stuff onto the function block 12, supplying method by dispenser nozzle 27 is shown, as shown in FIGS. 4A and 4B, it is possible to use the supplying method such as injecting the liquid stuff 24 onto the function block 12 by using ink jet head 28. In the method which uses ink jet head 28, it is possible to supply the liquid stuff onto function block 12 in a short period of time, therefore it is advantageous in productivity. When applying the liquid stuff by ink jet, the viscosity of the liquid stuff is an important factor, and therefore the addition of a diluting solvent to the liquid stuff aides in the adjustment to an appropriate viscosity.

As a diluting solvent which is usable with the liquid stuff of ultraviolet-curable resin, there is no limitation and for example, propyleneglycol monomethyl ether acetate, propyleneglycol monopropyl ether, methoxymethyl propionate, methoxyethyl propionate, ethyl cellosolve, ethyl cellosolve acetate, ethyl lactate, ethyl pyruvate, methyl amyl ketone, cyclohexanone, xylene, toluene, butyl acetate, etc., may be mentioned, and each solvent can be used alone or in combination of two or more types.

As usable diluting solvent for the liquid stuff of precursor of polyimide, for example, N-methyl-2-pyrrolidone, can be mentioned.

(4) Furthermore, in a predetermined area on function block 12, electrode layer 25 is formed in order to drive the function block 12 by using an ordinary metallizing method etc. In this embodiment, the example which forms the electrode layer 25 after lens shape part 20 is formed. Forming electrode layer 25 before forming lens shape part 20 is also available. By the above process, device 100 including function block 12 shown in FIG. 1 is obtained.

As explained above, in device 100 including function block 12 in this embodiment, function block 12 includes optical element 14 as a function element, and lens shape part 20 as a functionally formed part is formed in a predetermined area on function block 12. In the case in which the optical element 14 is a light receiving element, lens shape part 20 allows entering light to converge. Also, in case in which the optical element 14 is a light emitting element, lens shape part 20 can narrow the emission angle of light being emitted from optical element 14. In this way, in device 100 including function block 12, by forming lens shape part 20 as a functionally formed part on optical element 14, the functionality of optical element 14 as a function element can be enhanced.

Also, because anchoring part 22 which anchors function block 12 and base body 10 can be formed in the same process as lens shape part 20, the number of process can be reduced.

Second Embodiment
Construction of Device

Figure 5:
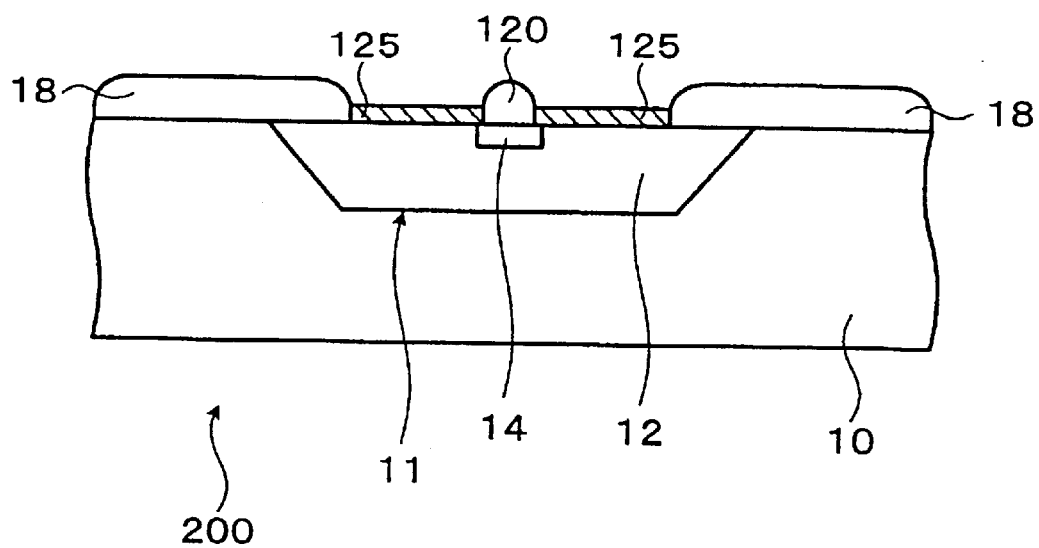
FIG. 5 is a cross section illustrating a device including function block according to the second embodiment of the present invention.

FIG. 5 is a cross section typically illustrating a device 200 including function block 12 according to the second embodiment of the present invention.

Device 200 including function block 12 in this embodiment is different from the device 100 according to the first embodiment, in that protecting layer 18 is formed on the surface of function block 12 so as to cover the entire border area between base body 10 and function block 12, and in that the surface of optical element 14 has an affinity for liquid resin and the surface of electrode layer 125 is treated so as to repel the liquid resin;therefore, as a result, the resin having the shape of a lens (lens shape part 120) is formed in a self-align manner on the opening of electrode layer 125 which is formed on optical element 14 as shown in FIG. 5. The rest of the part has a similar construction to device 100 according to the first embodiment. Detailed explanation of the part having a similar construction is omitted. In device 200 including function block 12, regarding the same organizing element as device 100 according to the first embodiment, the same reference numerals are used.

Lens shape part 120 has similar functions and effects as the functions and effects of lens shape part 20 according to the first embodiment. That is, lens shape part 120 is a functionally formed part, and optical element 14 is a function element. Therefore, in the case in which the optical element 14 is a light receiving element, lens shape part 120 has function which reflects light to allow light to converge onto a predetermined area on optical element 14, and in the case in which the optical element 14 is a light emitting element, lens shape part 120 has a function which reflects the emitted light and narrows the emission angle.

Operation of Device

The operation of device 200 including function block according to the second embodiment is similar to the operation of device 100 according to the first embodiment., and explanation of the operation thereof is omitted.

Manufacturing Process of Device

Figure 6:
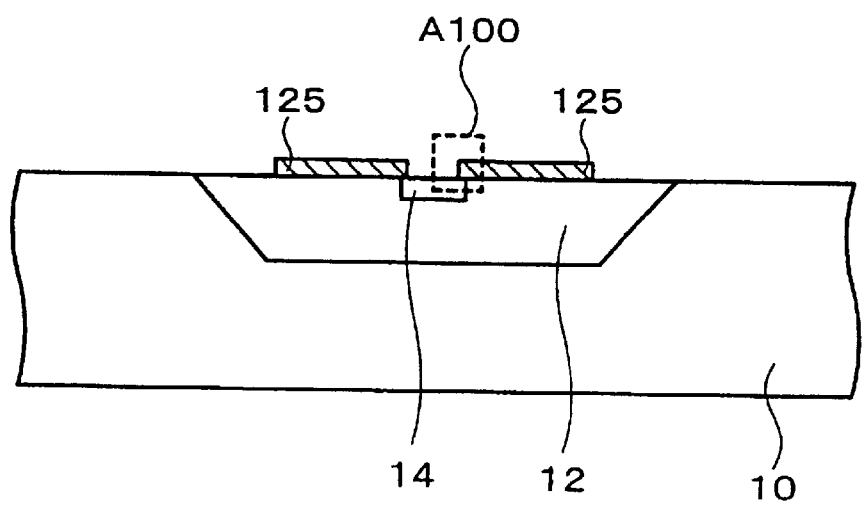
FIG. 6 is a cross section showing an example of the manufacturing process for the device shown in FIG. 5.
Figure 7:
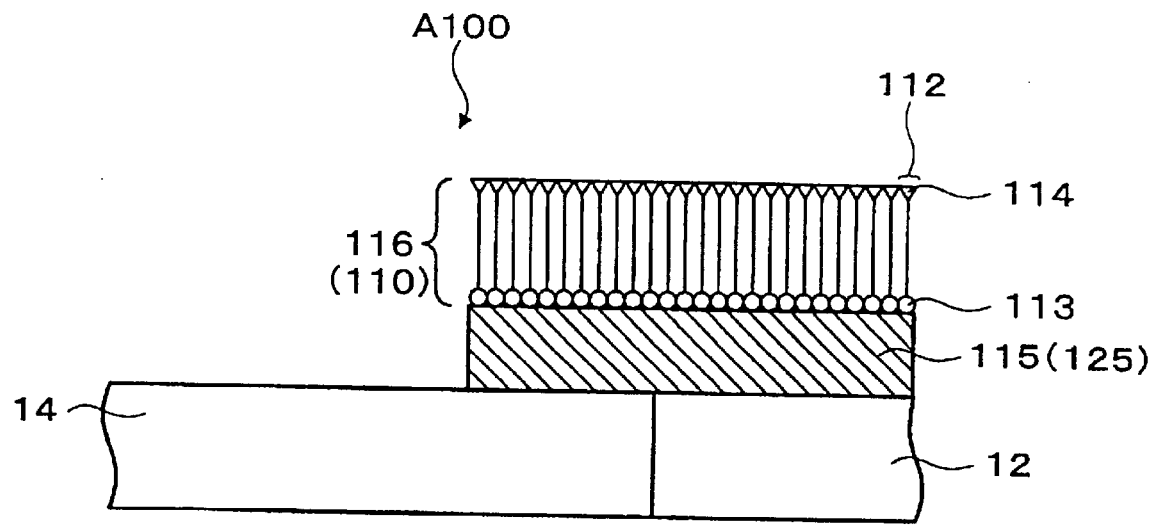
FIG. 7 is a magnified view of area A100 shown in FIG. 6.

Next, manufacturing process for device 200 including function block 12 as shown in FIG. 5 is explained. FIG. 6 and FIG. 7 are views showing an example of a manufacturing process for device 200.

(1) First, base body 10 is formed in such a way that function block 12 including optical element 14 is fit into concavity 11, by using an FSA method as well as device 100 according to the first embodiment.

Here, the surface of function block 12 is formed by the material which has an affinity for the liquid stuff which is described later. That is, the surface of function block 12 is formed by a material which does not repel the above-mentioned liquid stuff. In this way, in the process which is described below, above-mentioned liquid stuff can stably exist on function block 12 at the time of transmission of the above mention liquid stuff onto function block 12.

(2) Consequently, as shown in FIG. 6, electrode layer 125 is formed on function block 12. This electrode layer 125 is arranged so as to supply electricity to drive function block 12. In device 200 as shown in FIG. 5, a part of electrode layer 125 is disposed on optical element 14.

(3) Next, liquid repelling film 110 is formed on electrode layer 125. Liquid repelling film 110 has tendency to repel liquid stuff which is described below.

Here, in case that in which the surface of the metal layer which constitutes electrode layer 125 is gold layer 115, the liquid repelling film is, for example, made of a single molecular film which is obtained by the following process.

thiol having functional group on its terminal is dissolved in ethanol aqueous solution of 1 to 10 mM. When electrode layer 125 is immersed in this solution, a single molecular film of thiol (hereinafter called "thiol single molecular film") having functional group on its terminal is formed only on electrode layer 125.

Here, thiol having fluorine-containing functional group represented by for example $CF_3(CF_2)_n(CH_2)_mSH$ (m is an integer from 5 to 60, and n is an integer from 1 to 20) on its terminal can be called thiol having functional group on its terminal.

The reason why thiol single molecular film 116 is formed on electrode layer 125 is explained with reference to FIG. 6 and FIG. 7 as below.

FIG. 7 is a magnified view of the optic element 14 at the time of the completion of the formation of the thiol single molecular film 116, and the surface of a part of electrode layer 125 area A100 shown in FIG. 6 and FIG. 7 is a magnified view of a part of area A100 shown in FIG. 6.

Thiol has a characteristic that it adsorbs gold by chemical bonding in a covalent bonding between a sulfur atom of a mercapto group of the thiol and the gold atom. By this characteristic, when electrode layer 125 made of gold layer 115 is immersed in the solution including thiol having functional group 114, as shown in FIG. 7, thiol 112 having functional group 114 on its terminal is adsorbed to the surface of electrode layer 125 in such a way that mercapto group 113 is disposed towards electrode layer 125. In contrast, thiol 112 having functional group 114 on its terminal is not adsorbed on the surface of function block 12 including optical element 14. Also, functional group 114 existing on the terminal of the thiol appears on the surface of thiol single molecular film 116. As a result, thiol single molecular film 116 can be formed only on electrode layer 125.

This thiol single molecular film 116 operates as a liquid repelling film 110 for the following reason.

On the surface of this thiol single molecular film 116, as shown in FIG. 7, functional group 114 which is given a property that repels the liquid stuff which is to be described below appears. Because of this, thiol single molecular film 116 has a property that repels the liquid stuff which is described below, therefore thiol single molecular film 116 can function as liquid repelling film 110.

The advantage of forming liquid repelling film 110 by utilizing the adsorption in this way is the fact that liquid repelling film 110 can be formed selectively and easily on electrode layer 125.

In the above-mentioned embodiment, although it is mentioned that the liquid repelling film 110 is a single molecular film made of thiol having functional group 114, the liquid repelling film is not limited to this compound, and as long as the single molecular film has the characteristic of adsorbing to electrode layer 125 and repelling the above liquid stuff, it is usable as the liquid repelling film 110 of the present invention. In addition, repelling film 110 is not limited to a single molecular film, and as long as liquid repelling film 110 has a characteristic of repelling liquid stuff, there is no particular limitation. In addition, liquid repelling film 110 can be quickly removed according to the need.

Also, in the above manufacturing process, although it is mentioned that the surface of the metal layer which constitutes electrode layer 125 is gold layer 115, as long as the surface of the metal layer adheres to liquid repelling film 111, there is no particular limitation.

(4) Consequently, liquid stuff (not shown) is supplied onto function block 12 including optical element 14. As a liquid stuff supplying method, similarly to the case of the manufacturing process for device 100 according to the first embodiment, the supplying method by dispenser nozzle or the supplying method by ink jet can be used. Additionally, a spin-coat method, dipping method, spray-coat method, roll-coat method, or bar coat method can be utilized.

Function block 12 including optical element 14 is made of material which has a surface which does not repel liquid stuff. Therefore, when liquid stuff is supplied onto function block 12 including optical element 14, liquid stuff which is transmitted onto function block 12 which is exposed can stably exist. Also, liquid stuff which run over on electrode layer 125 is repelled by liquid repelling film 110 formed on electrode layer 125. Liquid stuff which is repelled is absorbed by the liquid stuff on the exposed surface of function block 12. As a result, liquid stuff remains on the exposed surface of function block 12. Liquid stuff remaining on the exposed surface of function block 12 forms lens shape part 120 and protecting layer 18 which produces the basic form of micro lens by surface tension.

(5) Furthermore, by hardening liquid stuff on function block 12, lens shape part 120 is formed on optical element 14, and protecting layer 18 which generally covers the border area between function block 12 and base body 10 is formed. By the above process, device 200 as shown in FIG. 5 is obtained.

Device 200 including a function block in this embodiment has similar functions and effects as device 100 according to the first embodiment.

Also, according to the manufacturing process for device 200 in this embodiment, lens shape part 120 which functions as a micro lens can be formed in a self-align manner simply by supplying the above liquid stuff to function device 12, and by hardening of the liquid stuff. As a result, lens shape part 120 which does not require adjustment of the optical axis alignment and which is free from optical axis deviation can be formed in a very easy process. In addition, because contact hole 16 can be formed at the same time as the forming of lens shape part 120 in a self-align manner, the number of process can be reduced.

Furthermore, by supplying liquid stuff after the forming of liquid repelling film 110 on electrode layer 125 at the time of forming lens shape part 120, it is possible to control the size and shape of lens shape part 120.

Third Embodiment
Construction of Device

Figure 8:
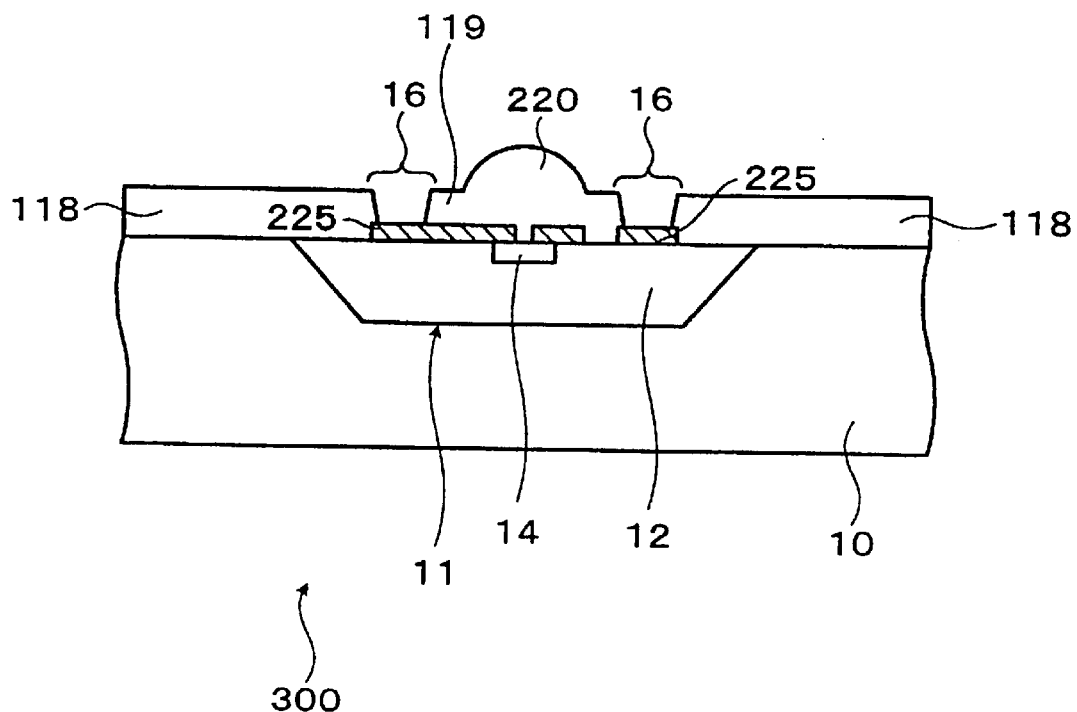
FIG. 8 is a cross section illustrating a device including a function block according to the third embodiment of the present invention.

FIG. 8 is a cross section typically illustrating a device 300 including function block 12 according to the third embodiment in present invention.

Device 300 including function block 12 of this embodiment has a similar construction to device 200 according to the second embodiment in that the protecting layer 118 is formed so as to cover the whole border area between base body 10 and function block 12. Therefore, the explanations for the parts which have a similar construction are omitted. On the other hand, device 300 is different from device 100 and 200 according to the first and the second embodiment in that the contact hole 16 is formed on device 300. In device 300, the same reference numeral is attached to organizing factors which are almost the same as device 100 and 200 according to the first and the second embodiment.

On device 300, protecting layer 119 including lens shape part 220 is formed. Lens shape part 220 has similar functions and effects to those of lens shape part 20 according to the first embodiment. That is, lens shape part 220 is a functionally formed part, and optical element 14 is a function element. Therefore, in the case in which the optical element 14 is a light receiving element, lens shape part 220 has a function which reflects light to allow the light to converge on a predetermined area on optical element 14, and in the case in which optical element 14 is a light emitting element, lens shape part 220 has function which reflects the emitted light to narrow the emission angle of the light.

Also, contact hole 16 is formed on electrode layer 225 and contact hole 16 form a part of contact which connects electrode layer 225 and external electrode (not shown).

Operation of Device

Operation of device 300 including function block 12 according to the third embodiment is similar to the operation of device 100 according to the first embodiment. Therefore, explanation is omitted.

(Manufacturing Process of Device)

Figure 9:
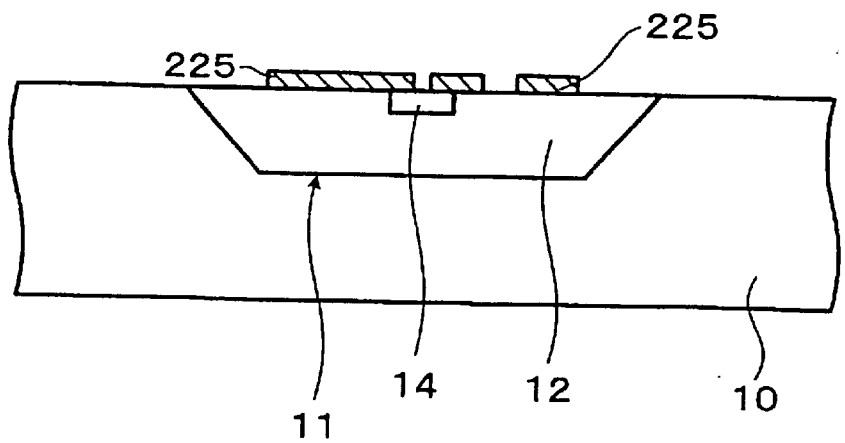
FIG. 9 is a cross section showing an example of a manufacturing process for the device shown in FIG. 8.
Figure 10:
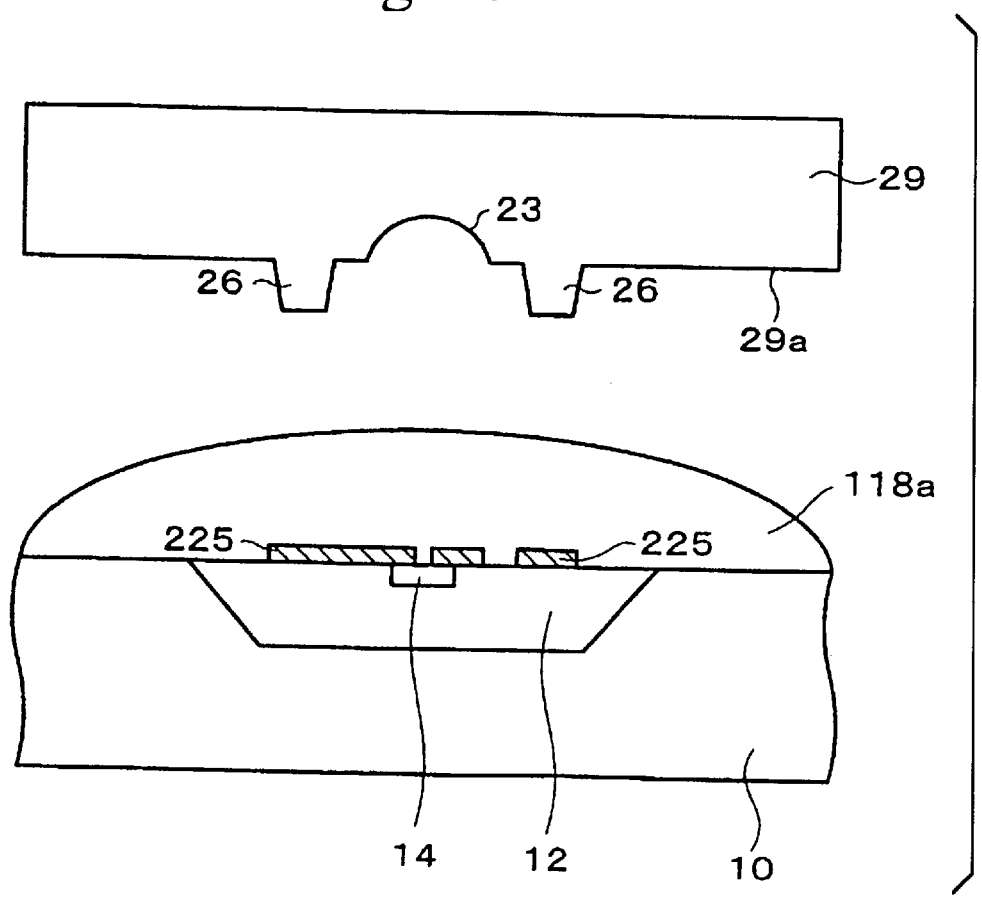
FIG. 10 is a cross section showing an example of a manufacturing process for the device shown in FIG. 8.
Figure 11:
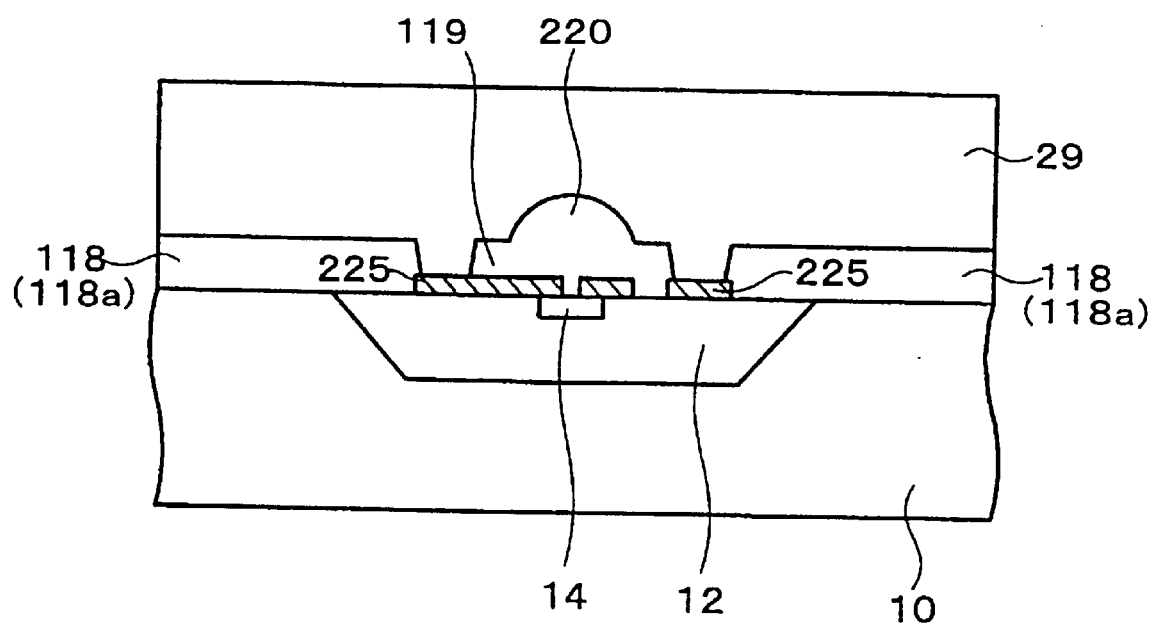
FIG. 11 is a cross section showing an example of a manufacturing process for the device shown in FIG. 8.

Next, a manufacturing process for device 300 as shown in FIG. 8 is explained. FIG. 9 through FIG. 11 are views showing an example of a manufacturing process for device 300.

(1) First, similarly to device 100 according to the first embodiment, base body 10 wherein function block 12 including optical element 14 is fit into concavity 11 is formed by using an FSA method.

(2) Consequently, as shown in FIG. 9, electrode layer 225 is formed on function block 12. The process until here is almost the same as that for device 200 according to the second embodiment.

(3) Next, the process for forming lens shape part 220 and protecting layers 118 and 119 on function block 12 is explained. FIG. 10 and FIG. 11 are cross sections showing a manufacturing process for protecting layer 118 and 119.

First, stamper 29 as shown in FIG. 10 is formed. Stamper 29 is made of material which is transparent to ultraviolet light. Also, stamper 29 has casting face 29a. Casting face 29a includes concavity 23 and convex part 26, casting face 29a has a complementary shape against lens shape part 220 and contact hole 16 of device 300 as final products. That is, concavities 23 becomes the complementary shaped part facing lens shape part 220 as a final product, and convex part 26 becomes the complementary shaped part facing contact hole 16 as a final product.

On casting face 29a, surface treatment should preferably be performed. This surface treatment is for the purpose of lowering the contact between protecting layers 118 and 119 which is described below and stamper 29 lower to be less than the contact between protecting layer 118 and 119 and function block 12. That is, this surface treatment is done for the purpose of facilitating the removal of the protecting layers 118 and 119 in the process, which is to be mentioned later, of removal of the protecting layers 118 and 119 from stamper 29. As this surface treatment, fluorine treatment by $CF_4$ gas plasma, etc., can be named. In this way, stamper 29 is manufactured.

Also, in manufacturing a stamper 29, a pattern is made first, and then stamper 29 is obtained by transcribing the complementary shape of this pattern. This pattern has the shape of lens shape part 200 and contact hole 16 of device 300 as a final product. Alternatively, stamper 29 can be made directly from the base body. That is, stamper 29 can be manufactured by forming concavity 23 and convex part 26 on base body by a wet etching method. In this case, as a material of the base body for forming stamper 29, metal, semi-conductor circuit board (silicon for example), quartz, glass, etc., can be used in addition to resin.

(4) Next, alignment of stamper 29 and base body 10 is adjusted in such a way that the concavity 23 of stamper 29 is positioned on optical element 14. As an aligning method, the following method can be mentioned.

1) Method in which adjusting the alignment of stamper 29 and the alignment of base body 10 respectively, and pasting by mechanical precision.
2) Method wherein putting an alignment mark as a target at the time of alignment on the surface of base body 10 on a side on which function block 12 is formed in the case in which stamper 29 is transparent, and performing alignment by utilizing the alignment mark.
3) Method wherein making a hole through stamper 29 in the perpendicular direction of the face which overlaps stamper 29 on base body 10 at the time of installing stamper 29 on base body 10 in the case in which the stamper 29 is not transparent, and performing alignment by utilizing the above alignment mark by way of the hole.

(5) After performing alignment of stamper 29 and base body 10, liquid stuff 118a of resin is introduced between stamper 29 and the base body 10, as shown in FIG. 10, liquid stuff 118a is put on the surface of base body 10. Also, alignment of stamper 29 and base body 10 can be done after liquid resin stuff 50 is put on the surface of base body 10.

As liquid resin stuff 118a, material which hardens by adding energy is favorable. Due to the fact that resin is liquid stuff, replenishing resin to concavity 23 of stamper 29 becomes easy. As liquid resin stuff 118a, for example, as shown in the first embodiment, ultraviolet-curable acrylic resin, ultraviolet-curable epoxy resin or precursor of thermosetting polyimide resin etc., can be mentioned. In particular, ultraviolet-curable resin can be conveniently used because ultraviolet-curable resin hardens only by exposure tor ultraviolet light. Also, because heat treatment is not added at the time of hardening of ultraviolet-curable resin, it is not necessary to be concerned about problems caused by differences in heat expansion between stamper 29 and function block 12 including optical element 14.

The method of applying liquid stuff 118a of resin to base body 10 is not limited, for example, methods which are shown in the second embodiment, the spin-coat method, dipping method, spray-coat method, roll-coat method, and bar-coat method can be used.

(6) Next, stamper 29 and base body 10 are closely adhered by resin. In this way, by adhering closely stamper 29 and base body 10, liquid resin stuff 118a is applied until reaching predetermined areas as shown in FIG. 11, and a layer consisting of liquid resin stuff 118a is formed between stamper 29 and base body 10. Additionally, at the time of the adhering of stamper 29 and base body 10, application of pressure may be performed by way of at least one of stamper 29 and base body 10. Also, stamper 29 and base body 10 can be adhered closely under vacuum condition of 10 Pa in order to avoid the entry of air bubbles inside the liquid stuff 118a.

(7) Consequently, liquid stuff 118a of resin is hardened. Regarding the hardening method, an appropriate method is selected according to the type of liquid stuff 118a of resin, and method which is explained in the first embodiment can be used. In the case in which the ultraviolet-curable resin is used, ultraviolet-curable resin can be hardened by exposure to ultraviolet light being emitted from stamper 29 side to the liquid stuff 118a of resin side.

By the above process, shape corresponding to casting face 29a of stamper 29 is transferred to base body 10, protecting layer 119 including protecting layer 118 and lens shape part 220 is formed. That is, as shown in FIG. 8, lens shape part 220 is formed in a corresponding part to concavity 23 of stamper 29, and contact hole 16 is formed in a corresponding part to convex part 26.

(8) Consequently, stamper 29 is removed from protecting layers 118 and 119 and base body 10. In this case, when surface treatment is performed on the casting face 29a of stamper 29 in order to help the separation of stamper 29 from protecting layers 118 and 119 in the above-mentioned process, stamper 29 can easily separate from protecting layers 118 and 119 and base body 10.

After stamper 29 separates, there are cases in which resin occasionally remains on the bottom part of contact hole 16. If resin remains, when a metal layer is formed on the bottom part of contact hole 16 in order to electrically connect this metal layer and electrode layer 225 by way of contact hole 16, electrical connection between electrode layer 225 and the metal layer cannot be sufficiently achieved. Also, for example, if electrode layer 225 is directly wire-bonded while the resin remains on the bottom part of contact hole 16, there are cases in which the problem that the wire and electrode layer 225 cannot be connected. Also, even if wire can successfully be connected to electrode layer 225, problems in which electric connection between wire and electrode layer 225 cannot sufficiently be achieved occur. Therefore, when resin remains on the bottom part of contact hole 16, in order to remove the remaining resin, for example, one of following process should preferably be perfomed.

First, resin remaining on the bottom part of contact hole 16 is removed by using an ashing method, which is a method wherein resin is removed in the gas phase. As a example of an ashing method, ozone ashing, and plasma ashing can be mentioned. Ozone ashing is a method wherein resin is removed by the chemical reaction of ozone and resist under an atmosphere of high density ozone. Plasma ashing is a method wherein resin is removed by using the plasma generated from reactive gas such as oxygen gas. By this method by ashing, because all the remaining resin in every contact hole 16 can be removed collectively in entire wafer, there is an advantage in that treatment time is short.

At second, burning off is performed on the bottom part of contact hole 16 by an excimer laser. That is, resin on the bottom part of contact hole 16 is burned and blown away by aiming and emitting the excimer laser beam having a diameter which narrows toward the bottom part of contact hole 16. By the excimer laser, because only the bottom part of contact hole 16 is securely treated, there is an advantage in that there is no concern about the breakage of lens shape part 220.

By the above process, as shown in FIG. 1, device 300 is obtained according to this embodiment.

Device 300 according to this embodiment has similar functions and effects to device 300 according to the first embodiment. Furthermore, because lens shape part 220 and contact hole 16 can be collectively formed by using stamper 29, for example as compared with the case of forming lens shape part 220 and contact hole 16 by using a photo-lithography method, the above manufacturing method is easy and the lead time for manufacturing can be reduced to a great extent. Also, stamper 29 can be used repeatably once it is made, and therefore manufacturing cost can be reduced and it is economical.

In the above embodiment, although stamper 29 is transparent to ultraviolet light, and stamper 29 can be a material which is not transparent to ultraviolet light such as metals. In the case in which the stamper 29 is metallic, stamper 29 can be manufactured by electroforming. The manufacture of stamper 29 by using electroforming has an advantage in that stamper 29 can be manufactured easily. In the case in which stamper 29 is made of material through which it is difficult to transmit ultraviolet light such as metal or semi-conductor, though ultraviolet-curable resin can not be applied to liquid stuff of resin, if thermalsetting resin such as above-mentioned precursor of termalsetting polyimide resin is used, similar function and effect to above-mentioned embodiment can be obtained.

Also, the driving method for the device in the above embodiment is only an example, and various modifications are possible unless the driving method deviates from the object of present invention. Also, in the above embodiment, although a device wherein one function block includes one optical element (function element) is shown, the configuration of the present invention is not degraded even if one function block includes plural function elements.

Two embodiments of present invention are explained as follows.

Figure 12:
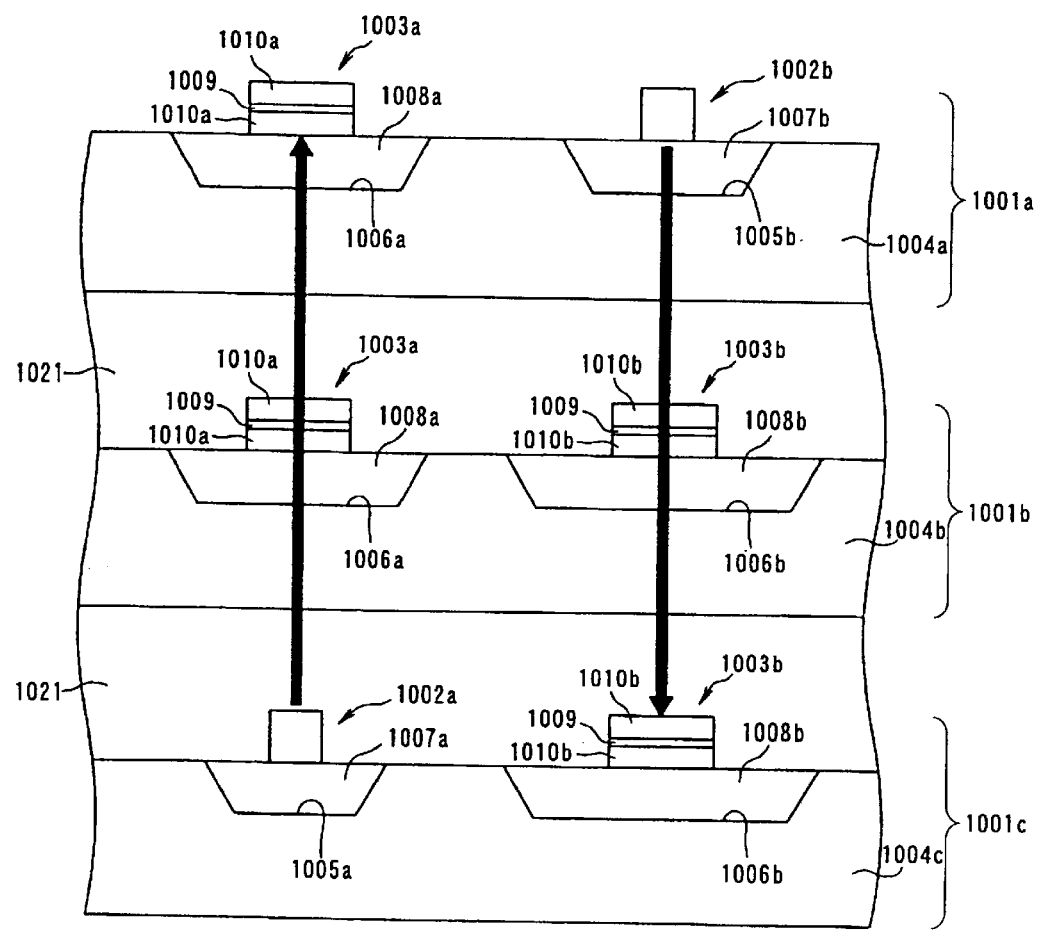
FIG. 12 is a shcematic view of the first embodiment of a light transmitting device of the present invention.

FIG. 12 is a general view of light interconnection device between layered IC chips as the first embodiment of a light transmitting device of the present invention. Here, IC chips (LSI) 1001a to 1001c such as CPUs and DRAMs are stacked in three layers. In this embodiment, the device is arranged in such a way that the light receiving element 1003a of IC chip in the middle layers and in the top layers 1001a and 1001b receive the light of light emitting element 1002a of IC chip 1001c in the bottom layer as shown, and light receiving element 1003b of IC chip 1001b and 1001c in the middle layer and bottom layer receives light of light emitting element 1002b of IC chip 1001a in the top layer. Therefore, the emission wavelength of one light emitting element 1002a is different from the emission wavelength of the other light emitting element 1002b, and the receiving wavelength of one light receiving element 1003b is different from the receiving wavelength of the other light receiving element 1003b. In this embodiment, base boards (base bodies) 1004a to 1004c of each IC chip and function blocks 1007a to 1008b are made of Si. Therefore, as a light of each light emitting element, wavelengths equal to or longer than 1.0 $\mu$m, more preferably wavelengths of equal to or longer than 1.1 $\mu$m are selected. The absorption coefficient of Si is 100 cm$^{-1}$ to 1.0 $\mu$m, which is large, and there is some loss. On the other hand, in the case in which the wavelength is equal to or longer than 1.1 $\mu$m, the absorption coefficient is equivalent to or less than 10 cm$^{-1}$, and it is small. Therefore, in this embodiment, the wavelength of the light of the light emitting element is set equal to or longer than 1.0 $\mu$m, and more preferably equal to or longer than 1.1 $\mu$m.

Because this wavelength of light is easily transmitted through Si, the transmission of a light signal from light emitting elements to light receiving elements facing each other is improved. Of course, adhesive layer 1021 which is described below is transparent to this range light wavelengths.

Figure 2:
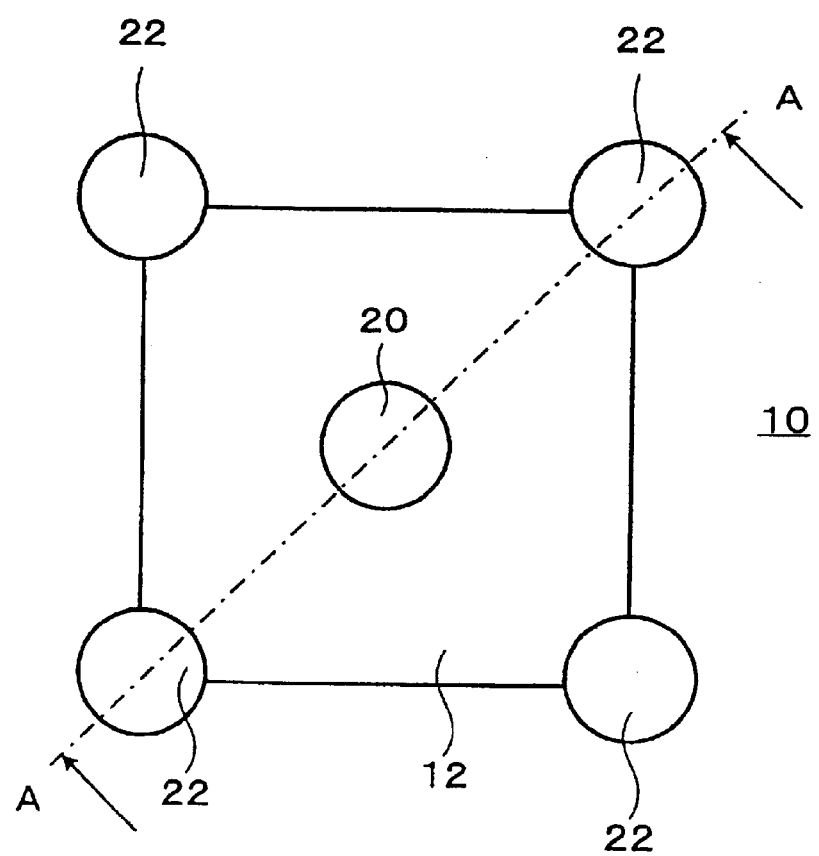
FIG. 2 is a plan view of the device shown in FIG. 1

On each base board 1004a to 1004c for each above-mentioned IC chip 1001a to 1001c, one area where each of the above-mentioned light emitting elements 1002a and 1002b and light receiving element 1003a and 1003b are to be mounted, concavities 1005b (1005a), 1006a (1006b) are formed. In each of concavities 1005b and 1006a, the bottom area is smaller than the top area, and the side part is of a concave trapezoidal shape. These concavities 1005b and 1006a, with such an inclination of the side part, can be formed quite precisely by anisotropic etching of Si. On at least the same base board 1004a, the condition such as size is different between concavities 1005b for light emitting element and concavities 1006a for the light receiving element. Also, in this embodiment, as shown in FIG. 2, other concavities such as concavities 1006a and 1006b of base board 1004b of IC chip, 1001b in the middle layer are different from concavities 1006b and concavities 1005a of the light emitting element of base board 1004c of IC chip 1001c in the bottom layer of the light emitting element in characteristics such as size. That is, for example if the same reference numeral is put on each of the concavities such as 1006a and 1006b, the characteristics such as the size is the same, and if different reference numerals are put on each of the concavities, the characteristics such the size is different. In other words, the concavities where the element with the same function is necessary has the same condition, and the concavities where the element with the different function is necessary has the different condition.

Figure 13:
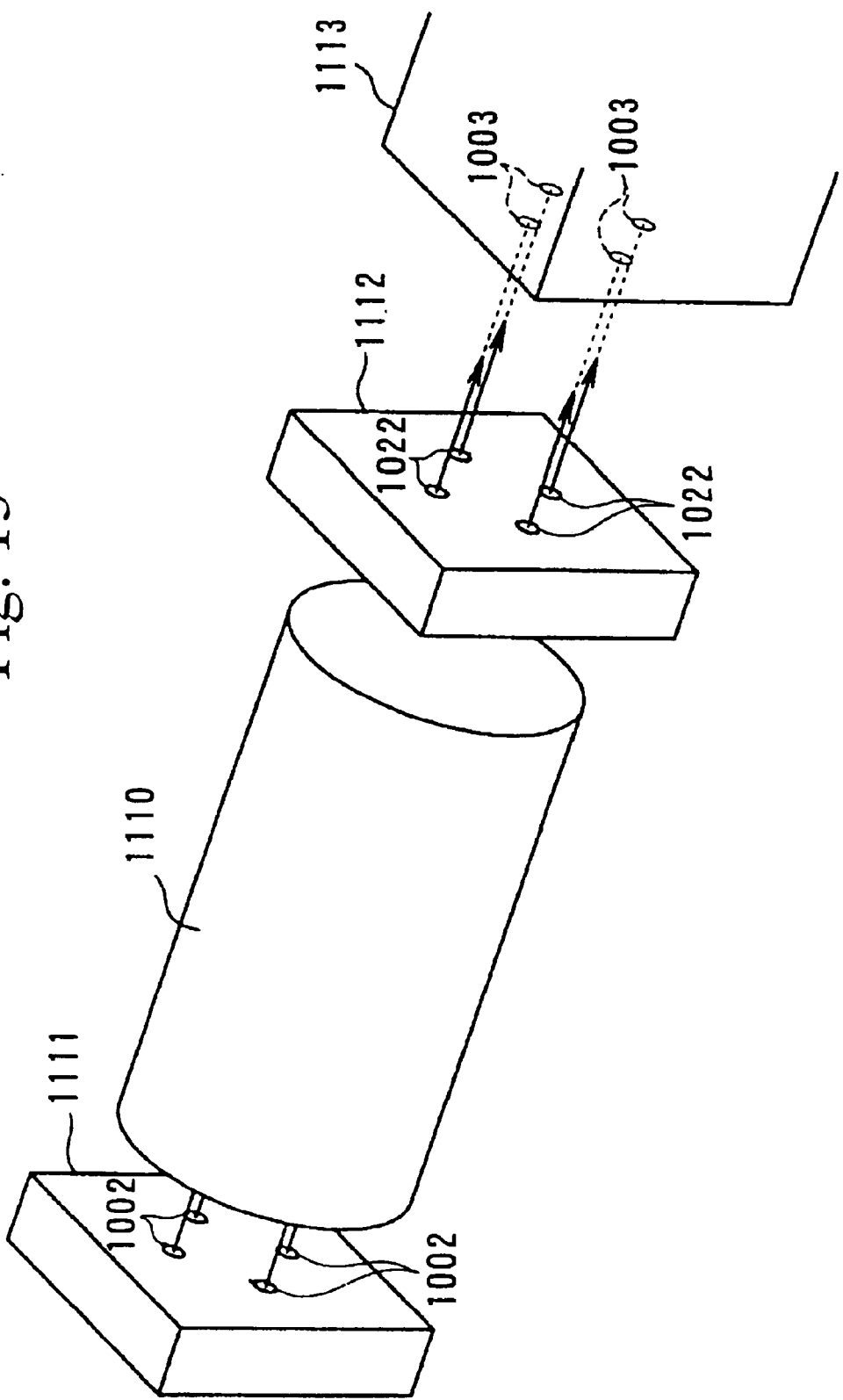
FIG. 13 is a schematic view of the second embodiment of a light transmitting device of the present invention.

Next, the second embodiment wherein the light transmission device of the present invention is applied to wavelength multi type light interconnection device is shown. Wavelength multi type light interconnection device is constructed in the manner shown in FIG. 13. This example is similar to, for example what is disclosed in Japanese Unexamined Patent Application, First Publication No. Hei 11-289317. This wavelength multi type light interconnection device comprises light emitting element array 1111 wherein plural light emitting elements 1002 with different wavelength are mounted, optical fiber 1110 which acts as a light wave guide, filter array 1112 wherein filter element 1122 which extracts lights of respective wavelengths from each of the above-mentioned light emitting elements 1002 is mounted, light receiving element array 1113 wherein light receiving element 1003 which receives respective wavelengths of light which are extracted by this filter array 1112 is mounted. Although each organizing factor is separated in the drawing for the convenience of understanding, actually each organizing factor is directly connected optically.

What is claimed is:

1. A manufacturing method for a device including a function block comprising following processes (a), (b), and (d), wherein a concavity is arranged on a base body, a function block including a function element in at least one part is fitted into said concavity in a self-adjusting manner is included in manufacturing method of device including function block, (a) process wherein liquid stuff is applied in predetermined area on said function block, (b) process wherein functionally formed part is formed by hardening said liquid stuff, and (d) a protecting layer is formed so as to cover at least one part of a border area between said function block and said base body.

2. The manufacturing method for a device comprising said function block according to claim 1 wherein said function block includes a semi-conductor device.

3. The manufacturing method for a device comprising said function block according to claim 1 wherein said function element is an optical element.

4. The manufacturing method for a device comprising said function block according to claim 3 wherein said functionally formed part is formed on said optical element, and said functionally formed part is formed so as to include a lens shape part.

5. The manufacturing method for a device comprising said function block according to claim 1 comprising (c) process wherein an electrode is formed in a predetermined area on said function block so as to drive said function block.

6. The manufacturing method for a device comprising said function block according to claim 1 comprising (d) process wherein said protecting layer is furthermore formed on said function block.

7. The manufacturing method for a device comprising said function block according to claim 1, wherein said liquid stuff is a resin or a liquid stuff including precursor of resin.

8. The manufacturing method for a device comprising said function block according to claim 1, wherein process (e) is furthermore included (e) liquid repelling film which has property which repels said liquid stuff is formed out of the area for forming said functionally formed part before said liquid stuff is applied.

9. The manufacturing method for a device comprising said function block according to claim 8, wherein in said process (b)

liquid stuff which is repelled by said liquid repelling film is disposed in the area for forming said functionally formed part.

10. The manufacturing method for a device comprising said function block according to claim 8, wherein said liquid repelling film is a single molecular film comprising a compound which adsorbs on an electrode formed on said function block.

11. The manufacturing method for a device comprising said function block according to claim 10, wherein said electrode is made of material including gold.

12. The manufacturing method for a device comprising said function block according to claim 10, wherein said single molecular film is made of thiol including an atomic group which has characteristics which repels said liquid stuff to the direction of one terminal.

13. The manufacturing method for a device comprising said function block according to claim 1, wherein said process (a) is a process wherein drops of said liquid stuff are made on top of dispenser nozzle, said drops are made touch predetermined area in said function block, and said liquid stuff is disposed in said predetermined area.

14. The manufacturing method for a device comprising said function block according to claim 1, wherein said process (a) is a process wherein said liquid stuff is injected into predetermined area on said function block by using ink head jet so as to dispose said liquid stuff in said predetermined area.

15. A manufacturing method for a device including function block comprising following process (a) and process (b), wherein concavities is arranged on base body, function block including function element in at least one part is filled into said concavities in self-adjusting manner is included in manufacturing method of device including function block, (a) process wherein liquid stuff is applied on at least one part of border area between said function block and said base body on the surface of said base body, and (b) process wherein anchoring part of said function block is formed by hardening said liquid stuff.

16. The manufacturing method for a device comprising said function block according to claim 15, wherein said anchoring part is functionally formed part.

17. The manufacturing method for a device comprising said function block according to claim 15, wherein said function block includes a semi-conductor device.

* * * * *

UNITED STATES PATENT AND TRADEMARK OFFICE
CERTIFICATE OF CORRECTION

PATENT NO. : 6,653,157 B2
DATED : November 25, 2003
INVENTOR(S) : Takayuki Kondo It is certified that error appears in the above-identified patent and that said Letters Patent is hereby corrected as shown below:

Column 1,
Line 10, "therefore" should be -- therefor --
Line 13, "utilizing" should be -- utilizes --
Line 41, "hole" should be -- holes --

Column 2,
Line 6, "choosen" should be -- chosen --

Column 5,
Line 41, "shcematic" should be -- schematic --
Line 55, delete second occurrence of "along"

Column 6,
Line 3, delete second occurrence of "the"

Column 8,
Line 13, both occurrences of "a" should be -- α --

Column 10,
Line 21, "mention" should be -- mentioned --
Line 33, "thiol" should be -- Thiol --
Line 34, "10mM" should be -- 10 mm --

Column 12,
Line 16, after "in" insert -- the --

Column 13,
Line 66, "tor" should be -- to --

Column 14,
Line 62, "a" should be -- an --

Column 15,
Line 37, "termalsetting" should be -- thermalsetting --

UNITED STATES PATENT AND TRADEMARK OFFICE
CERTIFICATE OF CORRECTION

PATENT NO. : 6,653,157 B2
DATED : November 25, 2003
INVENTOR(S) : Takayuki Kondo It is certified that error appears in the above-identified patent and that said Letters Patent is hereby corrected as shown below:

<u>Column 16,</u>
Line 43, after "such" insert -- as --

<u>Column 18,</u>
Line 36, "filled" should be -- fitted --

Signed and Sealed this

Twentieth Day of July, 2004

JON W. DUDAS
*Acting Director of the United States Patent and Trademark Office*